United States Patent
Ohba

(10) Patent No.: US 8,916,923 B2
(45) Date of Patent: Dec. 23, 2014

(54) NONVOLATILE SEMICONDUCTOR MEMORY

(75) Inventor: Ryuji Ohba, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/225,025

(22) Filed: Sep. 2, 2011

(65) Prior Publication Data

US 2012/0061746 A1 Mar. 15, 2012

Related U.S. Application Data

(63) Continuation of application No. PCT/JP2010/052450, filed on Feb. 18, 2010.

(30) Foreign Application Priority Data

Mar. 4, 2009 (JP) ................................ 2009-050972

(51) Int. Cl.
*H01L 29/792* (2006.01)
*H01L 21/28* (2006.01)
*H01L 29/423* (2006.01)
*H01L 29/51* (2006.01)
*B82Y 10/00* (2011.01)

(52) U.S. Cl.
CPC ........ *H01L 29/513* (2013.01); *H01L 21/28273* (2013.01); *H01L 29/42324* (2013.01); *H01L 29/4234* (2013.01); *B82Y 10/00* (2013.01); *H01L 21/28282* (2013.01)
USPC .................................. 257/325; 257/E29.309

(58) Field of Classification Search
CPC .................................................... H01L 29/792
USPC .......................................... 257/325, E29.309
See application file for complete search history.

(56) References Cited

U.S. PATENT DOCUMENTS

| | | | |
|---|---|---|---|
| 6,548,825 B1 * | 4/2003 | Yoshii et al. | .............. 257/24 |
| 6,680,505 B2 | 1/2004 | Ohba et al. | |
| 7,629,642 B2 | 12/2009 | Ohba | |
| 2002/0140023 A1 * | 10/2002 | Ohba et al. | .............. 257/315 |
| 2009/0212349 A1 | 8/2009 | Kai et al. | |

FOREIGN PATENT DOCUMENTS

| | | |
|---|---|---|
| JP | 2001-313342 | 11/2001 |
| JP | 2006-190990 | 7/2006 |

OTHER PUBLICATIONS

U.S. Appl. No. 13/419,930, filed Mar. 14, 2012, Ohba.
U.S. Appl. No. 13/426,842, filed Mar. 22, 2012, Ohba.
Office Action issued May 28, 2013, in Japanese Patent Application No. 2009-050972 filed Mar. 4, 2009 (with English translation).

* cited by examiner

*Primary Examiner* — Kevin Parendo
*Assistant Examiner* — Lamont Koo
(74) *Attorney, Agent, or Firm* — Oblon, Spivak, McClelland, Maier & Neustadt, L.L.P.

(57) ABSTRACT

According to one embodiment, in a nonvolatile semiconductor memory in which a charge store layer is formed on a tunnel insulating film formed on a channel region of a semiconductor substrate, a first nanoparticle layer containing first conductive nanoparticles is formed on the channel side, and a second nanoparticle layer containing a plurality of second conductive nanoparticles having an average particle size larger than the first conductive nanoparticles is formed on the charge store layer side. An average energy value $\Delta E_1$ required for charging one electron in the first conductive nanoparticle is smaller than an average energy value $\Delta E$ required for charging one electron in the second conductive nanoparticle, and a difference between $\Delta E_1$ and $\Delta E$ is larger than a heat fluctuation energy ($k_B T$).

15 Claims, 12 Drawing Sheets

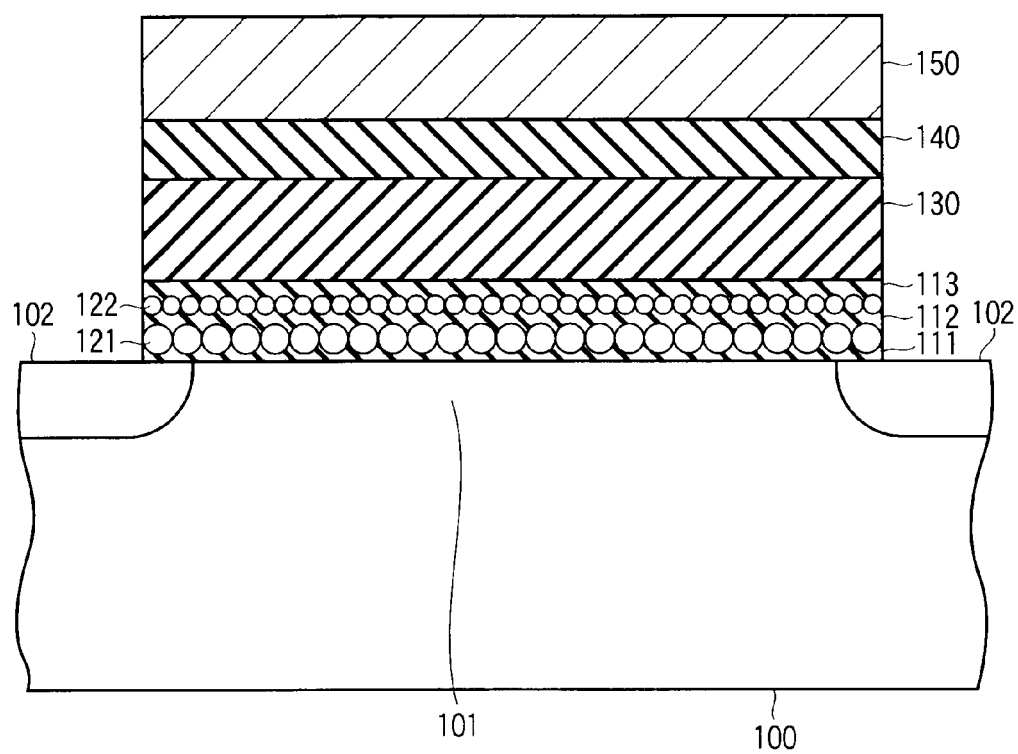
F I G. 1

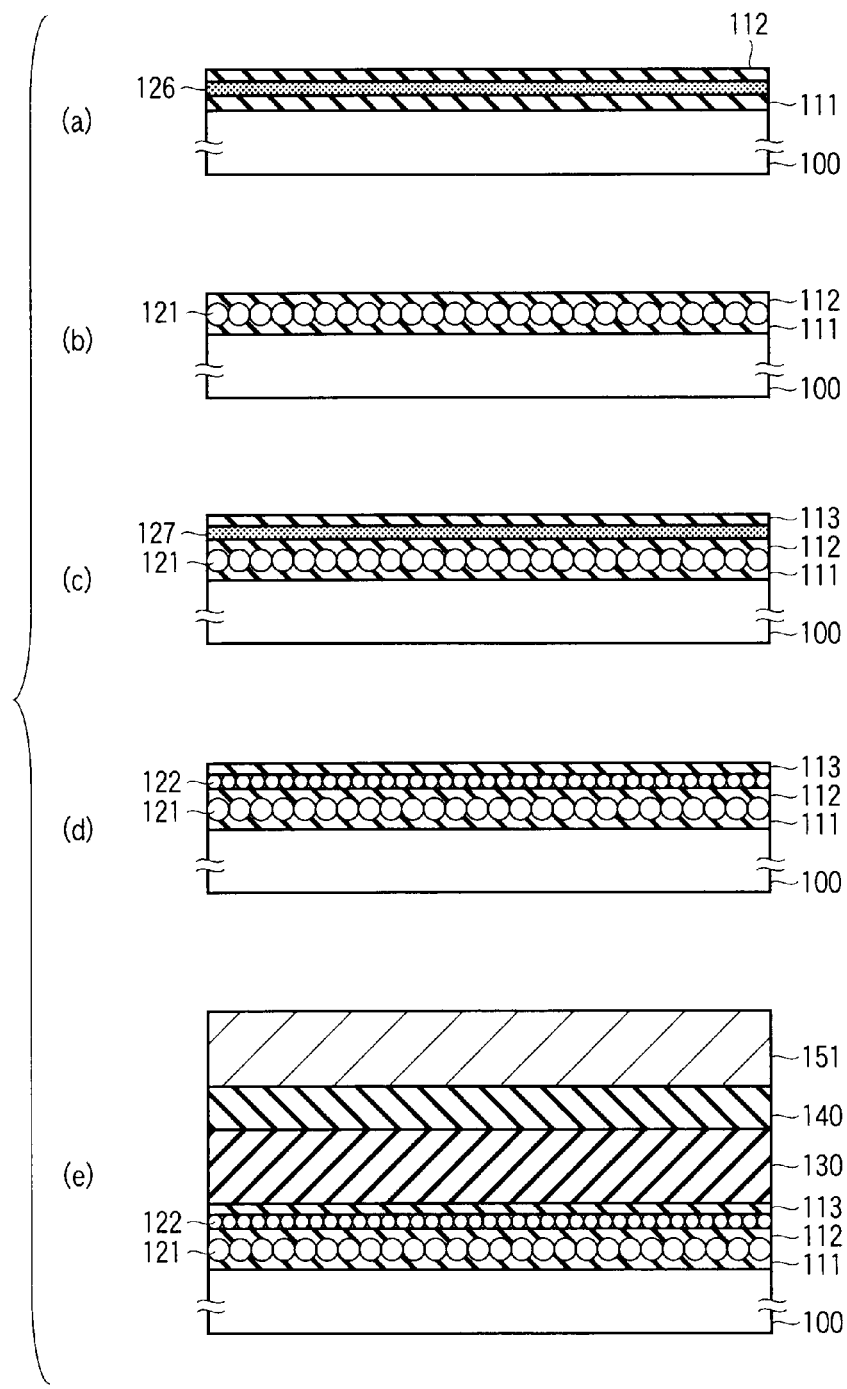
F I G. 2

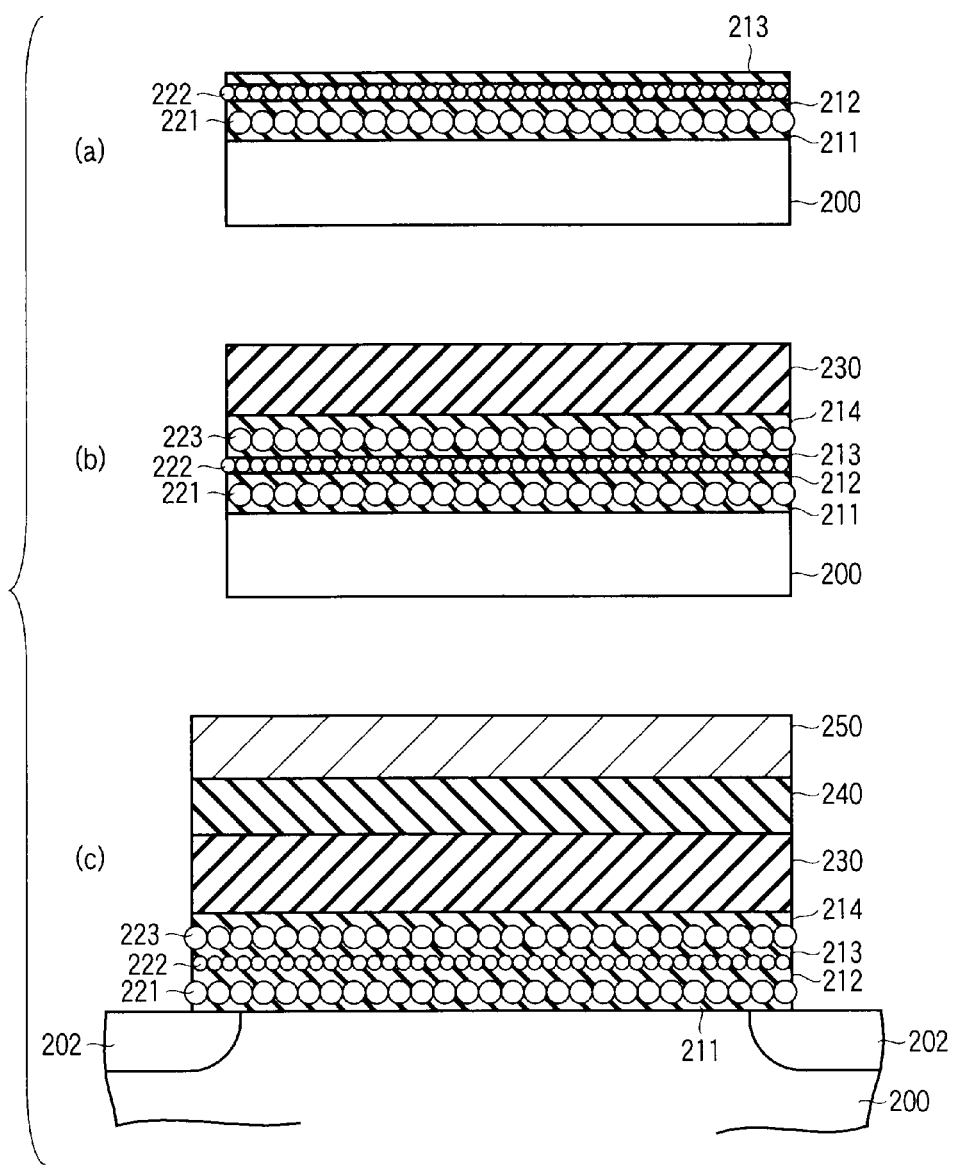
F I G. 5

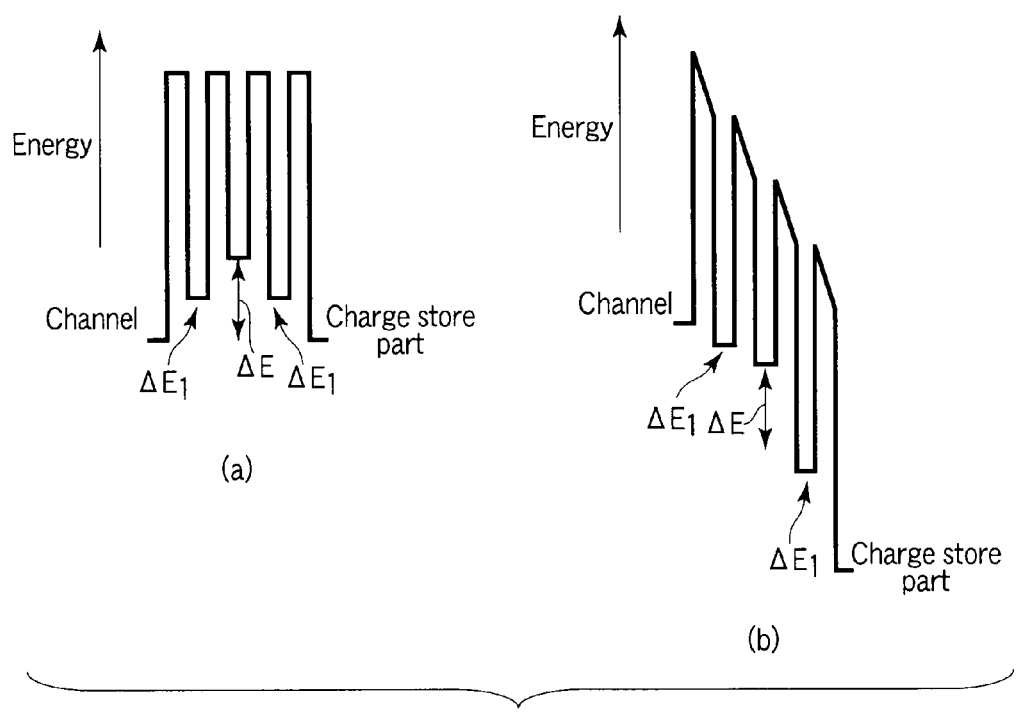
F I G. 6

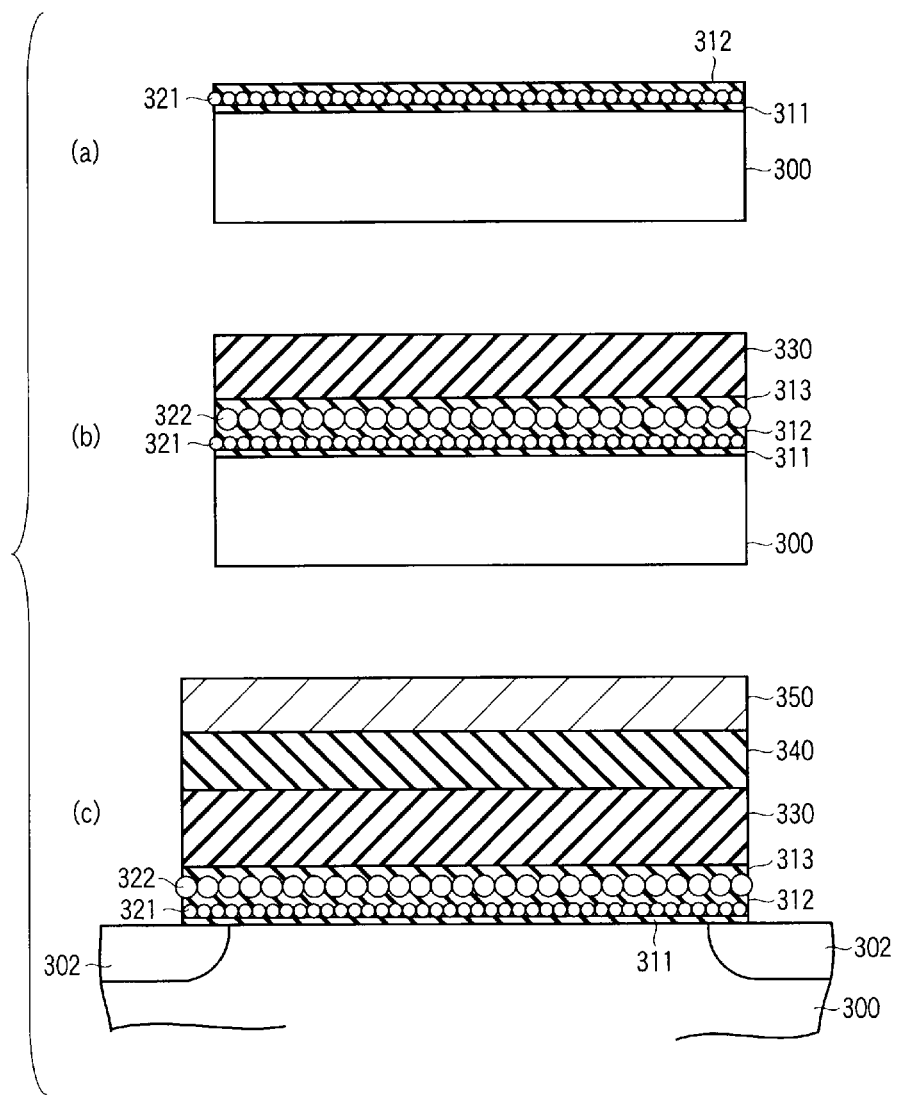
F I G. 7

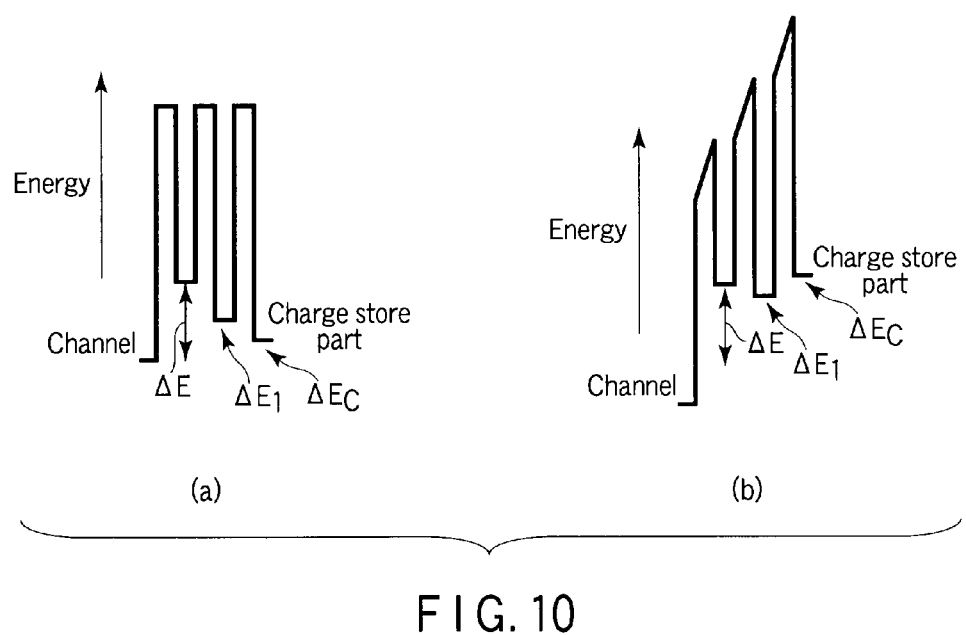
F I G. 10

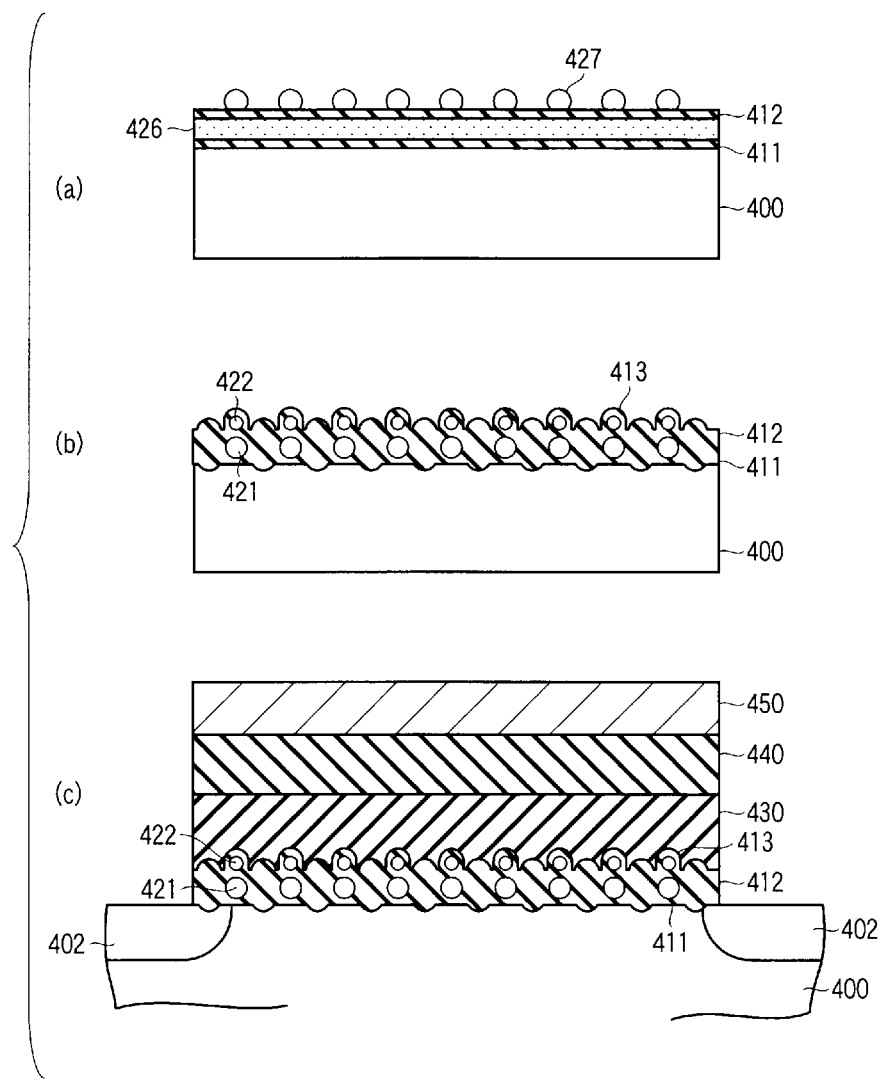
F I G. 11

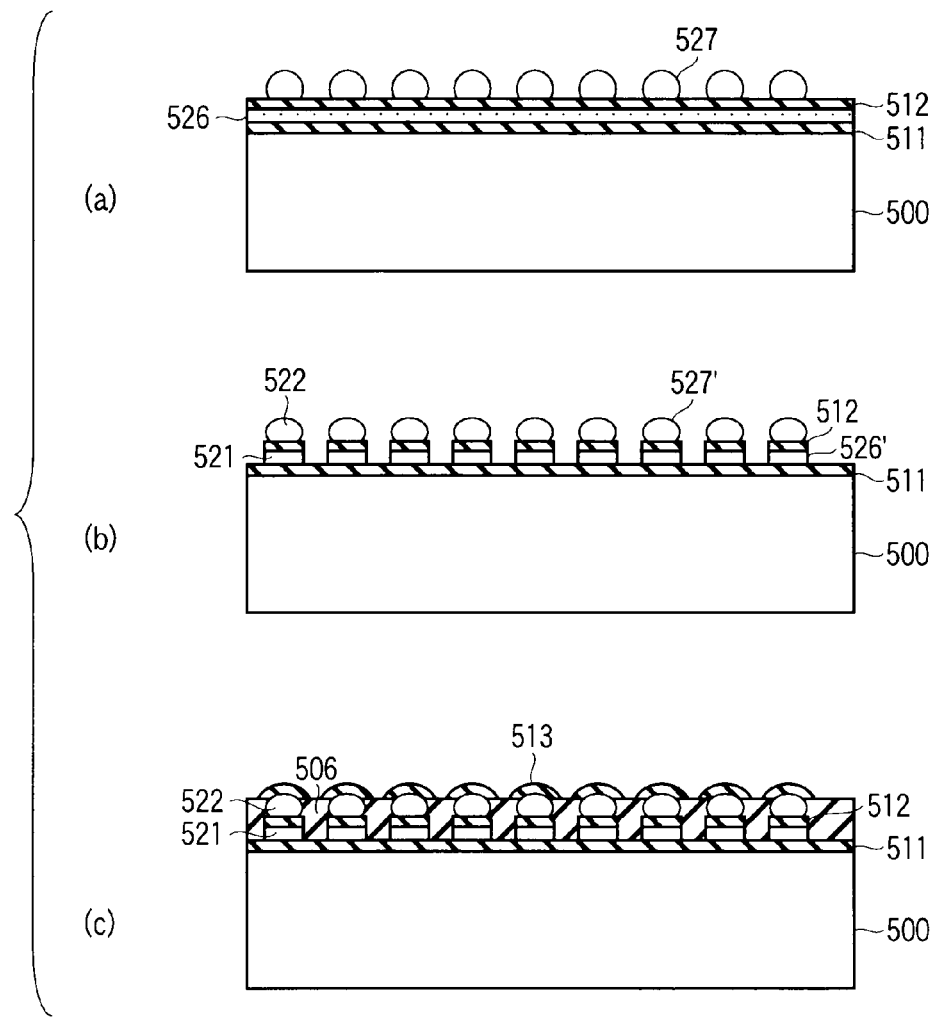
F I G. 12

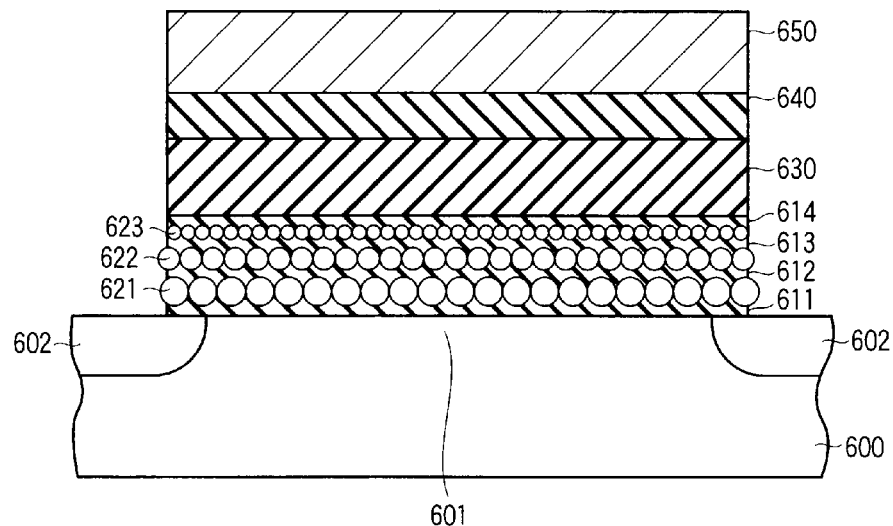
F I G. 13
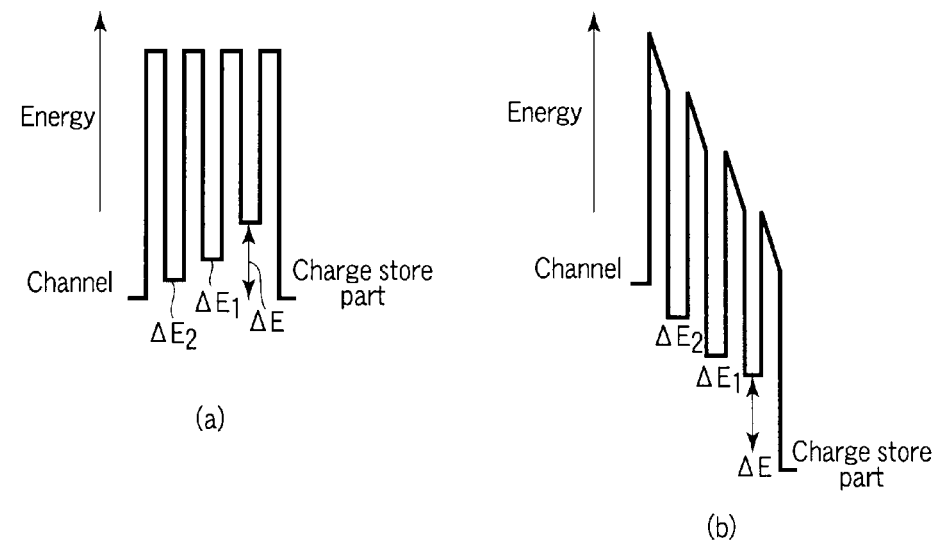
F I G. 14

NONVOLATILE SEMICONDUCTOR MEMORY

CROSS REFERENCE TO RELATED APPLICATIONS

This application is a Continuation Application of PCT Application No. PCT/JP2010/052450, filed Feb. 18, 2010 and based upon and claiming the benefit of priority from prior Japanese Patent Application No. 2009-050972, filed Mar. 4, 2009, the entire contents of all of which are incorporated herein by reference.

FIELD

Embodiments described herein relate generally to a nonvolatile semiconductor memory in which a charge storage layer is formed on a tunnel insulating film formed on the channel region of a semiconductor substrate and, more particularly, to a nonvolatile semiconductor memory having a nanoparticle layer in the tunnel insulating film.

BACKGROUND

In recent years, a nonvolatile semiconductor memory having a structure in which a nanoparticle layer containing conductive nanoparticles such as Si nanocrystals is inserted into a tunnel oxide film has been developed as an evolved MONOS nonvolatile semiconductor memory. This memory has a structure in which using a tunnel current, charges are exchanged between an Si surface and the trap level in a silicon nitride film (charge storage layer) via a double tunnel junction sandwiching the Si nanocrystals satisfying the Coulomb blockade condition between the tunnel oxide films.

In the semiconductor memory of this type, in the memory retention mode, an energy barrier $\Delta E$ by the Coulomb blockade effect and quantum confinement of the Si nanocrystals blocks the information charge tunnel. This allows to exponentially improve the storage retention characteristics in accordance with $\exp(\Delta E/k_B T)$. In the write/erase mode, since an appropriate write/erase voltage is applied to the memory, the information electrons tunnel without receiving an influence of the energy barrier $\Delta E$. This allows to perform high-speed write/erase.

When the particle size of the Si nanocrystals decreases, the energy barrier $\Delta E$ by the Coulomb blockade effect and quantum confinement increases, thereby improving the memory retention characteristics. When the particle size of the Si nanocrystals to assure the storage retention capability decreases and the energy barrier $\Delta E$ increases, degradation occurs due to a low energy barrier in the write/erase mode. That is, when the reduction of the particle size of the Si nanocrystals progresses, the energy barrier $\Delta E$ increases to exponentially improve the memory retention characteristics. However, the appearance of a low energy barrier in the write/erase mode starts to exponentially decrease the write/erase rate.

An increase in write/erase voltage allows to eliminate the low energy barrier. In this case, the increase in the write/erase voltage results in loss of device reliability. The memory retention improvement is undesirably insufficient while low-voltage high-speed write/erase is maintained.

CITATION LIST

Patent Literature

Patent Literature 1: Jp-A 2003-078050 (KOKAI)

BRIEF DESCRIPTION OF THE DRAWINGS

FIG. 1 is a sectional view showing the device structure of a nonvolatile semiconductor memory according to the first embodiment.

FIG. 2 shows sectional views of the steps in manufacturing the nonvolatile semiconductor memory according to the first embodiment.

FIG. 5 shows sectional views of the device structure of a nonvolatile semiconductor memory and steps in manufacturing the memory according to the second embodiment.

FIG. 6 shows energy band diagrams in a tunnel insulating film of the nonvolatile semiconductor memory according to the second embodiment.

FIG. 7 shows sectional views of the device structure of a nonvolatile semiconductor memory and steps in manufacturing the memory according to the third embodiment.

FIG. 10 shows energy band diagrams in a tunnel film when not only the buffer layer and minimum nanoparticle layer but also a charge storage layer is formed of quantum dots.

FIG. 11 shows sectional views of the device structure of a nonvolatile semiconductor memory and steps in manufacturing the memory according to the fourth embodiment.

FIG. 12 shows sectional views of the device structure of a nonvolatile semiconductor memory and steps in manufacturing the memory according to the fifth embodiment.

FIG. 13 is a sectional view showing the device structure of a nonvolatile semiconductor memory and a step in manufacturing the memory according to the sixth embodiment.

FIG. 14 shows energy band diagrams in a tunnel insulating film in the nonvolatile semiconductor memory according to the sixth embodiment.

DETAILED DESCRIPTION

Figure 3:
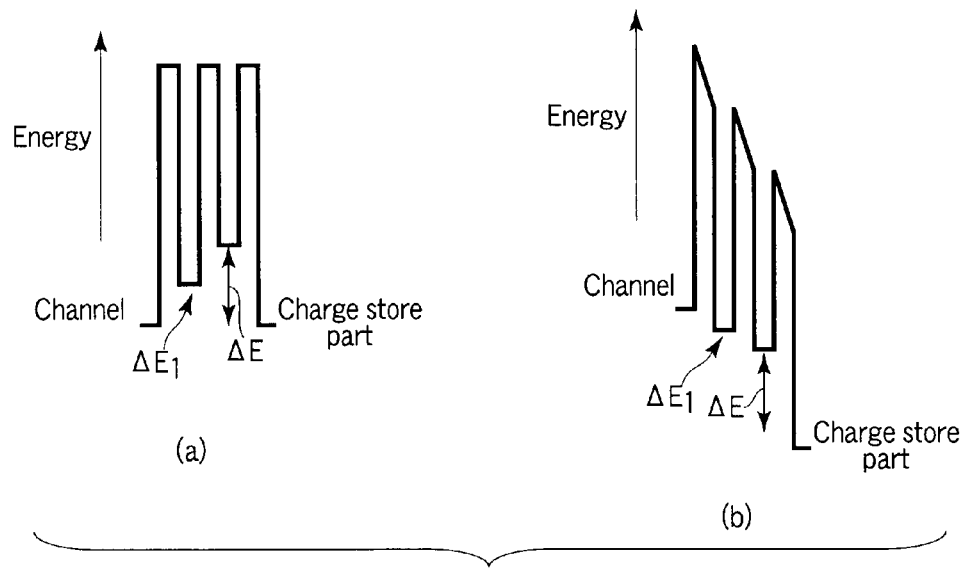
FIG. 3 shows energy band diagrams in a tunnel insulating film in the nonvolatile semiconductor memory according to the first embodiment.

In general, according to one embodiment, there is provided a nonvolatile semiconductor memory comprising: a first tunnel insulating film formed on a channel region of a semiconductor portion; a first nanoparticle layer formed on the first tunnel insulating film and containing a first conductive nanoparticle satisfying a Coulomb blockade condition; a second tunnel insulating film formed on the first nanoparticle layer; a second nanoparticle layer formed on the second tunnel insulating film and containing a second conductive nanoparticle having an average particle size smaller than that of the first conductive nanoparticle, and satisfying the Coulomb blockade condition; a third tunnel insulating film formed on the second nanoparticle layer; a charge storage layer formed on at least the third tunnel insulating film; an insulating film formed on the charge storage layer; and a gate electrode formed on the insulating film, wherein an average energy value $\Delta E_1$ required for charging one electron in the first conductive nanoparticle is smaller than an average energy value $\Delta E$ required for charging one electron in the second conductive nanoparticle, and a difference between $\Delta E_1$ and $\Delta E$ is larger than a heat fluctuation energy ($k_BT$).

According to the embodiment, even if the particle size of the nanoparticle layer inserted into the tunnel insulating film is reduced to increase the energy barrier and then improve the memory retention characteristics, degradation of the write/erase by the low energy barrier in the low-voltage/low-field write/erase can be prevented. This makes it possible to improve the memory retention characteristics and maintain the low-voltage high-speed write.

First Embodiment

FIG. 1 is a sectional view showing the device structure of a nonvolatile semiconductor memory according to the first embodiment. Note that one memory structure will be illustrated in the following description, but a plurality of memories each combined with a switching element and the like are arranged to form a semiconductor memory device.

Source/drain regions 102 are formed in the surface portion of a p-type Si substrate 100 so as to interpose a channel region 101. A first nanoparticle layer 121 made of Si nanoparticles each having a diameter of about 1.5 nm is formed on a 1-nm thick thermal oxide film (first tunnel insulating film) 111 formed on the channel region 101 of the substrate 100.

A second nanoparticle layer 122 made of Si nanocrystals having a diameter of about 1 nm is formed on a 1-nm thick thermal oxide film (second tunnel insulating film) 112 formed on the nanoparticle layer 121. The Si nanocrystals in the nanoparticle layers 121 and 122 satisfy the Coulomb blockade condition (the charge energy of one electron is larger than the heat fluctuation).

A charge storage layer 130 made of a silicon nitride film is formed on a 1-nm thick thermal oxide film (third tunnel insulating film) 113 formed on the nanoparticle layer 122. A gate electrode 150 made of 200-nm n⁺ poly-Si film is formed on a 6-nm thick block insulating film 140 formed on the charge storage layer 130.

In this embodiment, electrons can be exchanged between the surface of the Si substrate 100 and the trap level in the charge storage layer 130 via the triple tunnel junction obtained by sandwiching the nanoparticle layers 121 and 122 made of two types of nanocrystals satisfying the Coulomb blockade condition between the tunnel insulating films 111, 112, and 113.

Electron injection to the trap level in the charge storage layer 130 is performed as follows. Carrier electrons in the inversion layer which are generated in the Si substrate 100 by applying a positive voltage to the gate electrode 150 are injected to the trap level in the charge storage layer 130 using the tunnel current via the three tunnel insulating layers 111, 112, and 113 sandwiching the Si nanocrystals. A decrease in drain current due to the blocking of an electric field from the gate electrode 150 to the inversion layer using the trapped information charges is observed to read out information. The electrons are emitted from the charge storage layer 150 by applying a negative voltage to the gate electrode 150 unlike in the injection and tunneling the trapped electrons from the trap level in the charge storage layer 130 to the Si substrate 100 via the three tunnel insulating films 111, 112, and 113.

A method of manufacturing the semiconductor memory device according to this embodiment will be described below.

As shown in FIG. 2(a), a 1-nm thick thermal oxide film (first tunnel insulating film) 111 is formed on a p-type Si substrate 100. A 2-nm thick amorphous silicon (a-Si) film 126 is formed on the thermal oxide film 111 by a CVD apparatus. In this state, a 1-nm thick oxide film (second tunnel insulating film) 112 is formed on the surface of the a-Si film 126 by thermal oxidation. The thickness of the a-Si film 126 is 1.5 nm, and the a-Si film 126 is vertically sandwiched between the 1-nm oxide films 111 and 112. The resultant structure then undergoes high-temperature annealing in the nitrogen atmosphere, thereby converting the a-Si film 126 into a first nanoparticle layer 121 made of Si nanocrystals, as shown in FIG. 2(b).

As shown in FIG. 2(c), a 1.5-nm thick a-Si film 127 is deposited on the oxide film 112 by the CVD apparatus, and then a 1-nm thick oxide film (third tunnel insulating film) 113 is formed on the surface of the a-Si film 127 by thermal oxidation. In this state, the upper a-Si film 127 has a thickness of 1 nm, and the a-Si film 127 is vertically sandwiched by the 1-nm oxide films 112 and 113. The resultant structure then undergoes high-temperature annealing at 950° C. in the nitrogen atmosphere, thereby converting the a-Si film 127 into a second nanoparticle layer 122 made of Si nanocrystals, as shown in FIG. 2(d).

Upon forming crystals, the size of which is nearly equal to the film thickness of the a-Si film, lateral crystal growth can hardly occur by the Si film thickness due to the tendency that a crystal state for minimizing the surface energy is maintained. For this reason, when forming the nanoparticle layers 121 and 122 by adjusting the nitrogen annealing conditions, the particle size of the Si nanocrystals can be controlled to nearly the film thickness which is a typical size. Since the typical size is determined by the film thickness, the typical size of the Si nanocrystals of the lower first nanoparticle layer 121 is 1.5 nm, while the typical size of the Si nanocrystals of the upper second nanoparticle layer 122 is 1 nm.

As shown in FIG. 2(e), a 5-nm thick silicon nitride film is formed on the oxide film 113 by LPCVD to form the charge storage layer 130. Subsequently, a 6-nm thick oxide film (block insulating film) 140 is formed by LPCVD, and a 200-nm thick n⁺ poly-Si film 151 serving as a gate electrode 150 is deposited by CVD.

The poly-Si film 151 is selectively etched using a resist pattern (not shown) as a mask to form the gate electrode 150. The underlying layers of the gate electrode 150 are patterned to conform to the gate shape. Phosphorus ions are implanted in the substrate 100 at a dose of $1 \times 10^{15}$ cm⁻² and an acceleration energy of 5 keV. The resultant structure undergoes high-speed annealing for 10 sec at 1,000° C., thereby forming n⁺ diffusion layers 102 serving as the source/drain regions. The structure shown in FIG. 1 is thus obtained.

The reason why the memory device of the structure of this embodiment can improve the memory retention characteristics while maintaining low-voltage high-speed write will be described below. The energy barrier $\Delta E$ in the Si nanocrystals having a smaller size is higher than that having a larger size. As shown in FIG. 3(a), the barrier $\Delta E_1$ of the Si nanocrystals in the lower nanoparticle layer 121 is lower than the barrier $\Delta E$ of the Si nanocrystals in the upper nanoparticle layer 122.

In the write mode, when trapped electrons from the channel move to the charge storage layer 130, high-speed electron injection is enabled even in low-voltage write without any failure caused by the lower barrier $\Delta E_1$ of the lower Si nanocrystals because the lower barrier $\Delta E_1$ serves as a buffer, as shown in FIG. 3(b). On the other hand, in the data retention mode, electrons at $\Delta E_1$ of the lower Si nanocrystals move immediately toward the channel silicon having a lower energy. The $\Delta E_1$ of the lower Si nanocrystals does not serve as the buffer in information electron leakage in the memory retention mode. In order to leak the information electrons between the channel and the charge storage layer 130 in the memory retention mode, the information electrons must exceed the higher energy barrier ΔE of the upper Si nanocrystals. The memory retention can be improved in accordance with $\exp(\Delta E/k_B T)$. Therefore, the reduction of the particle size of the upper Si nanocrystals allows to improve exponential memory retention, while low-voltage high-speed write can be maintained due to the presence of the buffer layer ($\Delta E_1$) in the write mode.

In a single nanoparticle layer as in the conventional case, when the size of the Si nanocrystals is reduced, ΔE increases to exponentially improve memory retention, as shown in FIG. 4(a). However, the appearance of a lower energy barrier in the write/erase mode starts to exponentially decrease the write/erase rate, as shown in FIG. 4(b). The lower energy barrier can be eliminated by increasing the write/erase voltage. However, the reliability of the device is lost by the increase in write/erase voltage. Therefore, the conventional technique is not sufficient in improvement of the memory retention while maintaining low-voltage high-speed write/erase.

As described above, according to this embodiment, the two nanoparticle layers are formed, and the particle size of the lower nanoparticle layer 121 is made larger than that of the upper nanoparticle layer 122. This makes it possible to suppress degradation of write/erase caused by the lower energy barrier, improve the memory retention, and maintain low-voltage high-speed write.

According to this embodiment, the charge storage layer 130 is made of the silicon nitride film, and the traps in the nitride film are used to trap information electrons. However, a so-called floating gate electrode made of n⁺ poly-Si can be used as the charge storage layer 130. To use the floating gate electrode, a gate electrode is formed on an interlayer insulating film formed on the floating gate electrode. Even in this case, like the above embodiment, the memory retention can be exponentially improved by reducing the size of the upper Si nanocrystals while maintaining high-speed low-voltage write by the buffer layer ($\Delta E_1$) using the lower Si nanocrystals.

Second Embodiment

FIGS. 5(a), 5(b), and 5(c) are sectional views showing the device structure of a nonvolatile semiconductor memory and steps in manufacturing the memory according to the second embodiment.

As in the first embodiment described above, as shown in FIG. 5(a), a 1-nm thick thermal oxide film (first tunnel insulating film) 211 is formed on an Si substrate 200. A 2-nm thick a-Si film is deposited on the thermal oxide film 211 by the CVD apparatus. A 1-nm thick oxide film (second tunnel insulating film) 212 is formed on the a-Si film by thermal oxidation. The thickness of the a-Si film is 1.5 nm, and the a-Si film is vertically sandwiched between the 1-nm thickness oxide films 211 and 212. The resultant structure then undergoes high-temperature annealing at 950° C. in the nitrogen atmosphere, thereby converting the a-Si film into a first nanoparticle layer 221 made of Si nanocrystals.

A 1.5-nm thick a-Si film is deposited on the oxide film 212 by the CVD apparatus, and a 1-nm thick oxide film (third tunnel insulating film) 213 is formed on the surface of the a-Si film by thermal oxidation. The thickness of the upper a-Si film is 1 nm, and the upper a-Si film is vertically sandwiched between the 1-nm oxide films 212 and 213. The resultant structure then undergoes high-temperature annealing at 950° C. in the nitrogen atmosphere, thereby converting the a-Si film into a second nanoparticle layer 222 made of Si nanocrystals. The foregoing steps are the same as in the first embodiment.

As shown in FIG. 5(b), a 2-nm thick a-Si film is deposited on the oxide film 213 by the CVD apparatus. A 1-nm thick oxide film (fourth tunnel insulating film) 214 is formed on the surface of the a-Si film by thermal oxidation. The thickness of the uppermost a-Si film is 1.5 nm, and this a-Si film is vertically sandwiched between the oxide films 213 and 214. The resultant structure then undergoes high-temperature annealing at 950° C. in the nitrogen atmosphere, thereby converting the a-Si film into a third nanoparticle layer 223 made of Si nanocrystals.

Upon forming the crystals, the size of which is nearly equal to the thickness of the a-Si film, and due to a minimum surface energy, lateral crystal growth can hardly occur with a small Si film thickness. The particle size can be adjusted to nearly the film thickness by adjusting the annealing time. Since the film thickness determines a typical size, the typical size of the Si nanocrystals in the lower nanoparticle layer 221 is 1.5 nm, the typical size of the Si nanocrystals in the intermediate nanoparticle layer 222 is 1 nm, and the typical size of the Si nanocrystals in the uppermost nanoparticle layer 223 is 1.5 nm. Thereafter, a 5-nm thick charge storage layer 230 is formed on the oxide film 214 by LPCVD using a silicon nitride film.

As shown in FIG. 5(c), a 6-nm thick block insulating film 240 is formed by LPCVD. A 200-nm thick n⁺ poly-Si film serving as a gate electrode is deposited by CVD. A gate electrode 250 is then formed by etching using a resist pattern as a mask. Subsequently, phosphorus ions are implanted in the substrate at a dose of $1 \times 10^{15}$ cm$^{-2}$ and an acceleration voltage of 5 keV. The resultant structure undergoes high-speed annealing for 10 sec at 1,000° C. to form n⁺ diffusion layers 202 serving as the source/drain regions. This makes it possible to form a nonvolatile semiconductor memory capable of improving memory retention while maintaining low-voltage high-speed write/erase.

The reason why the memory device of the structure of this embodiment can improve the memory retention characteristics while maintaining low-voltage high-speed write and erase will be described below. The energy barrier ΔE in the Si nanocrystals having a smaller size is higher than that having a larger size. As shown in FIG. 6(a), the barrier $\Delta E_1$ of the Si nanocrystals in the lower nanoparticle layer 221 and the uppermost nanoparticle layer 223 is lower than the barrier ΔE of the Si nanocrystals in the intermediate nanoparticle layer 222.

In the write and erase modes, when trapping electrons from the channel to the charge storage layer 230, high-speed electron injection is allowed even in low-voltage write without any failure caused by the lower barrier $\Delta E_1$ of the lower Si nanocrystals 221 because the lower barrier $\Delta E_1$ lower than ΔE of the center Si nanocrystals 222 serves as a buffer, as shown in FIG. 6(b). In the erase mode as well, if bilateral symmetry is set, high-speed electron emission is allowed even in low-voltage erase without degradation by the low energy barrier because the lower barrier $\Delta E_1$ of the uppermost layer, which is lower than ΔE of the center Si nanocrystals, serves as a buffer.

On the other hand, in the data retention mode, electrons at $\Delta E_1$ of the lower Si nanocrystals move immediately toward the channel silicon having a lower energy. Electrons at $\Delta E_1$ of the uppermost Si nanocrystals move immediately toward the charge storage layer 230 having a lower energy. For these reasons, the barriers $\Delta E_1$ of the lower and uppermost Si nanocrystals do not serve as the buffers in information electron leakage in the memory retention mode. In order to leak the information electrons between the channel and the charge storage layer 230 in the memory retention mode, the information electrons must exceed the higher barrier $\Delta E$ of the intermediate Si nanocrystals. The memory retention can be improved in accordance with $\exp(\Delta E/k_B T)$. Therefore, the reduction of the particle size of the intermediate Si nanocrystals allows to improve exponential memory retention, while low-voltage high-speed write and erase can be maintained due to the presence of the buffer layers ($\Delta E_1$) in the write and erase modes.

According to this embodiment, the charge storage layer 230 is made of the silicon nitride film, and the traps in the nitride film are used to trap information electrons. However, a so-called floating gate electrode made of n$^+$ poly-Si can be used as the charge storage layer 230. Even in this case, like the above embodiment, the memory retention can be exponentially improved by reducing the size of the intermediate Si nanocrystals while maintaining high-speed low-voltage write and erase by the buffer layers ($\Delta E_1$) using the lower and uppermost Si nanocrystals.

In this embodiment, the buffer layers of the lowermost nanoparticle layer 221 and the uppermost nanoparticle layer 223 have the same particle size and the same energy barrier $\Delta E_1$. However, if the buffer layers have energy barrier levels lower than that of the Si nanocrystals of the intermediate nanoparticle layer 222, the buffer layers may have different particle sizes and different barrier energy levels to obtain the same effect as in high-speed low-voltage write and erase of the above embodiment.

Third Embodiment

FIGS. 7(a), 7(b), and 7(c) are sectional views showing the device structure of a nonvolatile semiconductor memory and steps in manufacturing the memory according to the third embodiment.

As shown in FIG. 7(a), a 1-nm thick thermal oxide film (first tunnel insulating film) 311 is formed on an Si substrate 300. A 1.5-nm thick a-Si film is deposited on the thermal oxide film 311 by the CVD apparatus. A 1-nm thick oxide film (second tunnel insulating film) 312 is formed on the a-Si film by thermal oxidation. The thickness of the a-Si film is 1 nm and the a-Si film is vertically sandwiched between the 1-nm thick oxide films 311 and 312. The resultant structure then undergoes high-temperature annealing at 950° C. in the nitrogen atmosphere. The a-Si film is converted into a first nanoparticle layer 321 made of Si nanocrystals.

As shown in FIG. 7(b), a 2-nm thick a-Si film is deposited on the oxide film 312 by the CVD apparatus, and a 1-nm thick oxide film (third tunnel insulating film) 313 is formed on the surface of the a-Si film by thermal oxidation. The thickness of the upper a-Si film is 1.5 nm, and the upper a-Si film is vertically sandwiched between the 1-nm oxide films 312 and 313. The resultant structure then undergoes high-temperature annealing at 950° C. in the nitrogen atmosphere. The a-Si film is converted into a second nanoparticle layer 322 made of Si nanocrystals.

Upon forming the crystals, the size of which is nearly equal to the thickness of the a-Si film, and due to a minimum surface energy, lateral crystal growth can hardly occur with a small Si film thickness. The particle size can be adjusted to nearly the film thickness by adjusting the annealing time. Since the film thickness determines a typical size, the typical size of the Si nanocrystals in the lower nanoparticle layer 321 is 1 nm, and the typical size of the Si nanocrystals in the upper nanoparticle layer 322 is 1.5 nm. Thereafter, a 5-nm thick charge storage layer 330 is formed on the oxide film 313 by LPCVD using a silicon nitride film.

As shown in FIG. 7(c), a 6-nm thick block insulating film 340 is formed by LPCVD. A 200-nm thick n$^+$ poly-Si film serving as a gate electrode is deposited by CVD. A gate electrode 350 is then formed by etching using a resist pattern as a mask. Subsequently, phosphorus ions are implanted in the substrate at a dose of $1\times10^{15}$ cm$^{-2}$ and an acceleration voltage of 5 keV. The resultant structure undergoes high-speed annealing for 10 sec at 1,000° C. to form n$^+$ diffusion layers 302 serving as the source/drain regions. This makes it possible to form a nonvolatile semiconductor memory capable of improving memory retention while maintaining low-voltage high-speed erase.

A delay in erase in the so-called MONOS memory using a trap layer represented by a silicon nitride film as the charge storage layer is well known. This is because the mechanism for emitting carriers from the charge storage layer when the charge storage layer is made of a trap level is different from that when the charge storage layer is made of an electrode.

The reason why the structure of this embodiment can improve the memory retention characteristics while maintaining low-voltage high-speed erase of the MONOS memory as compared with the conventional technique will be described below. The energy barrier $\Delta E$ in the Si nanocrystals having a smaller size is higher than that having a larger size. As shown in FIG. 8(a), the barrier $\Delta E_1$ of the Si nanocrystals in the upper nanoparticle layer 322 is lower than the barrier $\Delta E$ of the Si nanocrystals in the lower nanoparticle layer 321.

In the erase mode, when emitting electrons from the electron traps of the charge storage layer 330 to the channel, high-speed electron injection is allowed even in low-voltage erase without any failure caused by the energy barrier because the lower energy barrier $\Delta E_1$ of the upper Si nanocrystals serves as a buffer, as shown in FIG. 8(b). On the other hand, in the data retention mode, electrons at $\Delta E_1$ of the upper Si nanocrystals move immediately toward the charge storage layer 330 having a lower energy. The $\Delta E_1$ of the upper Si nanocrystals does not serve as the buffer in information electron leakage in the memory retention mode. In order to leak the information electrons between the channel and the charge storage layer in the memory retention mode, information electrons must exceed the higher barrier $\Delta E$ of the lower Si nanocrystals. The memory retention can be improved in accordance with $\exp(\Delta E/k_B T)$. Therefore, the reduction of the particle size of the lower Si nanocrystals allows to improve exponential memory retention, while low-voltage high-speed erase can be maintained due to the presence of the buffer layer ($\Delta E_1$) in the erase mode. The problem posed by the conventional technique in the erase rate-determining process can be thoroughly solved.

According to this embodiment, there can be solved the erase rate-determining process particularly posed by the so-called MONOS memory in which the charge storage layer 330 is made of the silicon nitride film, and the traps in the nitride film are used to trap information electrons. However, a so-called floating gate electrode made of n$^+$ poly-Si can be used as the charge storage layer 330. Even in this case, like the above embodiment, the memory retention can be exponentially improved by reducing the size of the lower Si nanocrystals while maintaining high-speed low-voltage erase by the buffer layer ($\Delta E_1$) using the uppermost Si nanocrystals.

In the first to third embodiments, silicon is used as the substrate semiconductor. However, any other semiconductor may be used. In the first to third embodiments, the silicon oxide film is used as the tunnel insulating film material. However, any other insulating material may be used to achieve the same effect as in the silicon oxide film. In the first to third embodiments, the silicon nitride film or n+ poly-Si is used as the charge storage layer. Any other trap layer material containing a large number of carrier traps or any other electrode material may be used. In the first to third embodiments, the silicon oxide film is used as the block insulating film 340. However, any other insulating structure may be used.

The above embodiments can obtain an improvement effect by the multilayered structure of the Si nanocrystals in the tunnel insulating films and the design for changing the particle sizes of the nanocrystals. According to the present specification, tunnel films containing Si nanocrystals are mainly described. However, even any other conductive nanoparticle material can obtain the same improvement effect by the multilayered structure and the design for changing their particle sizes.

Several desirable conditions to achieve the effects of the embodiment will be described below. The embodiment utilizes a tunnel current via an energy level formed by carrier confinement in conductive nanoparticles such as Si nanocrystals in a tunnel insulating film. More specifically, the embodiment utilizes the following phenomenon. No quantum state is present within the $\Delta E$ energy range of the conductive nanoparticles. For this reason, when $\Delta E$ blocks the movement of the carriers as in the memory retention mode, the carriers must pass over the energy level of the $\Delta E$ energy barrier. This effect can be achieved because the energy level $\Delta E$ of the conductive nanoparticles is higher than the heat fluctuation $k_B T$ (where $k_B$ is the Boltzmann constant and T is the absolute temperature, and $k_B T$ is about 26 meV at room temperature).

When the conductive nanoparticles are made of a metal material, $\Delta E$ is the Coulomb blockade energy. If they are made of a semiconductor, $\Delta E$ is determined by the Coulomb blockade energy and the quantum confinement energy. The Coulomb blockade energy as one of the main factors of $\Delta E$ is given as nearly $q/(2\pi \in d)$ where d [nm] is the particle size (diameter), q is the elementary electric charge, and $\in$ is the dielectric constant of the tunnel insulating film material if the conductive nanoparticles have a spherical or nearly spherical shape. This formula allows to estimate the desirable range of the size d of the conductive nanoparticles. The particle size d of the conductive nanoparticles used in the embodiment must satisfy $$q/(2\pi\in d) > k_B T$$

That is, $$d < d\max = q/(2\pi\in k_B T)$$

If a typical tunnel film is a silicon oxide film,
dmax=30 nm

The desirable upper limit of the energy $\Delta E_1$ of the buffer nanoparticle layer (or the lower limit of the particle size $d_1$) will now be described. According to the embodiment, the conductive nanoparticles having a larger particle size and the energy $\Delta E_1$ ($<\Delta E$) lower than the energy $\Delta E$ of the minimum conductive nanoparticles is used as a buffer to implement high-speed write or high-speed erase. To effectively function $\Delta E_1$ as the lower buffer energy, $$\Delta E - \Delta E_1 > k_B T$$

that is, $\Delta E_1$ is desirably lower than the heat fluctuation by a significant difference:

$$\Delta E_1 < \Delta E - k_B T$$

Letting d be the minimum particle size and $d_1$ be the particle size of the buffer, the following expression is given:

$$q/(2\pi\in d) - q/(2\pi\in d_1) > k_B T$$

that is, the buffer particle size is desirably given by $$d_1 > d/[1 - k_B T/\{q/(2\pi\in d)\}] = d/(1 - d/d\max)$$

If the typical tunnel insulating film is the silicon oxide film, $$d\max = q/(2\pi\in k_B T) = 30 \text{ nm},$$

so that the following relation is desirable:

$$d_1 > d/\{1 - d/(30 \text{ nm})\}$$

Figure 4:
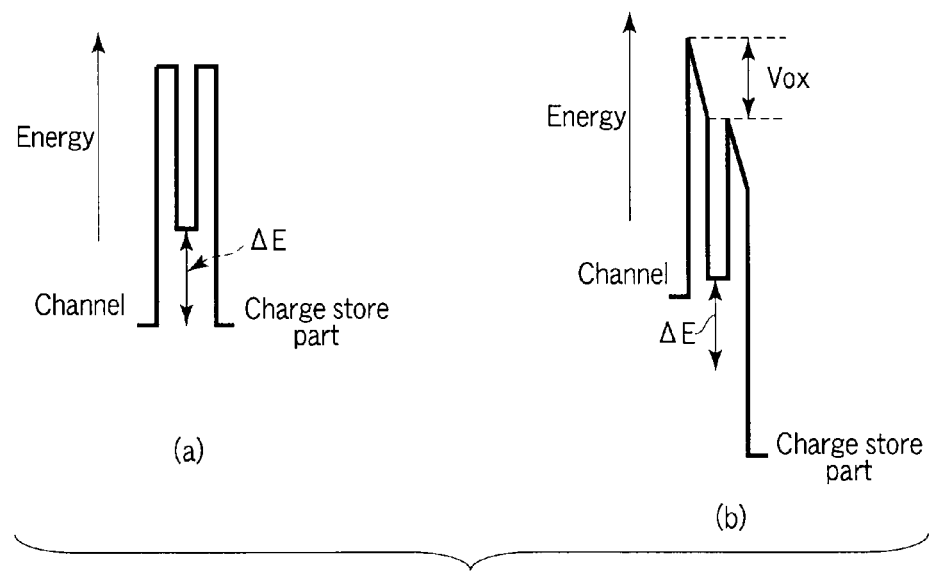
FIG. 4 shows energy band diagrams in a tunnel insulating film in the conventional nonvolatile semiconductor memory.

Letting Tox be the thickness of the tunnel insulating film (111 in FIG. 1 or 211 in FIG. 5) between the buffer layer and the channel to achieve high-speed write or the thickness of the tunnel film (214 in FIG. 5 or 313 in FIG. 7) between the buffer and the charge storage part in the high-speed erase mode, in order to eliminate the write/erase energy barrier shown in FIG. 4(*b*) to achieve high-speed write/erase, an electric field of $\Delta E_1/q$Tox or more must be applied to the tunnel insulating film. An electric field reduction $(\Delta E - \Delta E_1)/q$Tox by the arrangement of the buffer layer under the above physical condition $\Delta E - \Delta E_1 > k_B T$ is given by $$(\Delta E - \Delta E_1)/q\text{Tox} > 0.26 \text{ [MV/cm]}$$

even if a case in which the controllable smallest silicon oxide film thickness is about 1 nm as the thickness Tox. Since the electric field applied to the tunnel film in the write/erase mode is about 10 MV/cm, this may not provide a sufficient effect. The buffer layer $\Delta E_1$ is desirably relatively lower. If the effect of the electric field reduction is 1 MV/cm (=0.1 V/nm) or more, an effect of 10% or more can be desirably expected. More specifically, $$\Delta E/q\text{Tox} - \Delta E_1/q\text{Tox} \geq 0.1 \text{ [V/nm]}$$

that is $$\Delta E_1 \leq \Delta E - 0.1 \text{ [eV/nm]} \times \text{Tox}$$

is more desirable. The desirable condition of the particle size is given by $$d_1 > d/[1 - (0.1 \text{ [eV/nm]} \times \text{Tox})/\{q/(2\pi\in d)\}]$$

When the buffer layer is located on the upper side of the minimum nanocrystalline layer to enable the erase, Tox is the tunnel film thickness of the buffer layer on the side of the storage portion. When the buffer layer is located on the lower side of the minimum nanocrystalline layer to enable the write, Tox is the tunnel film thickness of the layer on the side of the channel. Assuming that the typical tunnel insulating film is the silicon oxide film, and the thickness Tox is 1 nm which is the smallest controllable thickness, that is, $$\Delta E_1 \leq \Delta E - 0.1 \text{ [eV]}$$

the particle size is desirably given by $$d_1 > d/\{1 - d/(8.5 \text{ nm})\}$$

In addition, if the electric field reduction effect is 2 MV/cm (=0.2 V/nm) or more, an effect of about 20% or more can be desirably expected. That is, $$\Delta E/q\text{Tox} - \Delta E_1/q\text{Tox} \geq 0.2 \text{ [V/nm]}$$

More particularly, the following condition is desirable:

$$\Delta E_1 \leq \Delta E - 0.2 \text{ [eV/nm]} \times \text{Tox}$$

The particle size desirably falls within the following range:

$$d_1 > d/[1 - (0.2 \text{ [eV/nm]} \times \text{Tox})/\{q/(2\pi\in d)\}]$$

Assuming that the typical tunnel insulating film is a silicon oxide film and that the thickness Tox is 1 mm which is the smallest controllable thickness, the desirable condition is given by $$\Delta E_1 \leq \Delta E - 0.2 \text{ [eV]}$$

The desirable particle size is $$d_1 > d/[1-d/4 \text{ nm}]$$

Figure 8:
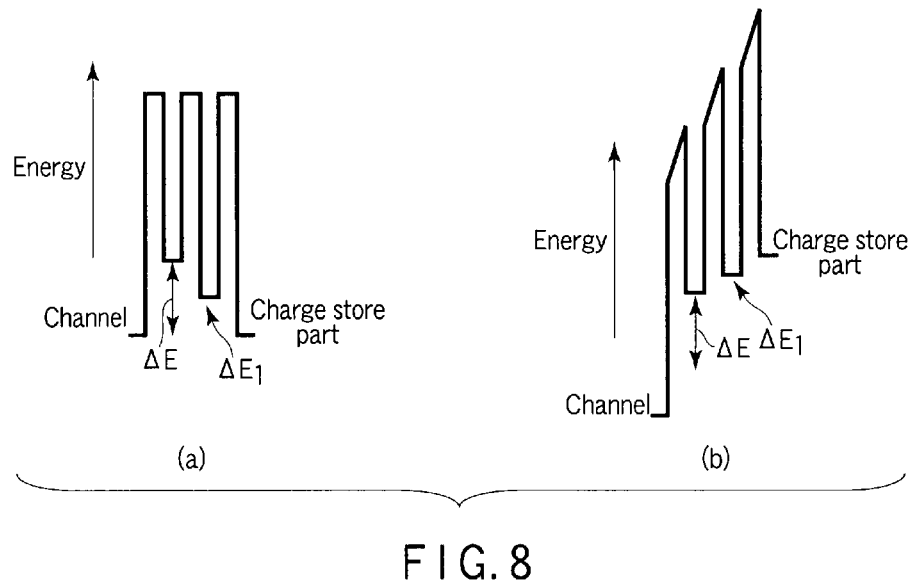
FIG. 8 shows energy band diagrams in a tunnel insulating film of the nonvolatile semiconductor memory according to the third embodiment.
Figure 9:
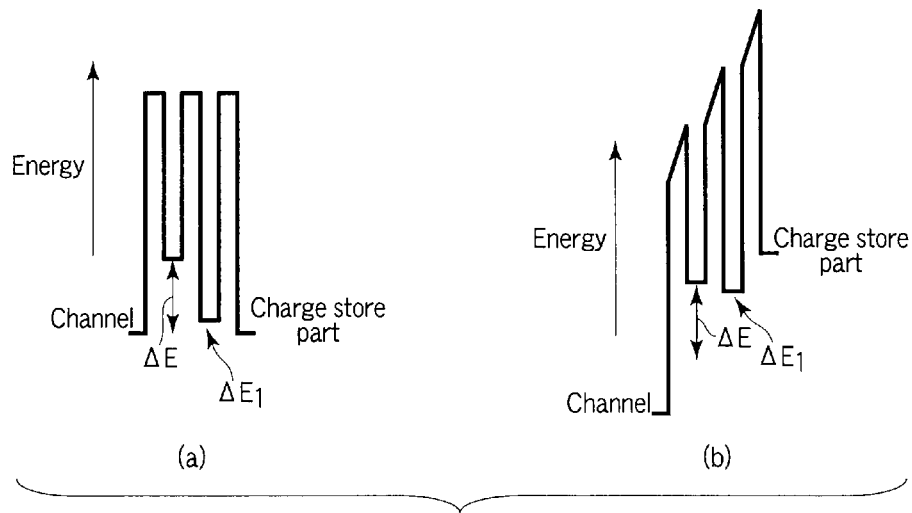
FIG. 9 shows energy band diagrams in a tunnel film when the particle size of a buffer Si nanocrystalline layer increases.

The desirable lower limit of the energy $\Delta E_1$ of the buffer nanoparticle layer (or the upper limit of the particle size $d_1$) will be described below. According to the embodiment, the relatively low energy barrier $\Delta E_1$ ($<\Delta E$) is set. However, an excessively low $\Delta E_1$ may not provide the satisfactory result. Consider the high-speed erase of the third embodiment (FIGS. 7 and 8). FIG. 9 shows a case in which the particle size of the buffer layer (upper nanoparticle layer 322) increases, and $\Delta E_1$ is lowered. As shown in FIG. 9(b), no energy barrier from the charge storage layer 330 to the $\Delta E_1$ of the buffer is present in the erase mode. However, by excessively lowering $\Delta E_1$, $\Delta E_1$ of the buffer is lower in energy than $\Delta E$ of the minimum nanocrystalline layer (lower nanoparticle layer 321). As a result, the energy barrier from the buffer layer 322 to the minimum nanocrystalline layer 321 is generated, which obviously fails to perform a satisfactory erase.

Conditions capable of forming a barrier between the buffer layer and the minimum nanocrystalline layer will be described below. Letting Tox1 be the thickness of the tunnel insulating film 313 between the charge storage layer 330 and the buffer layer 322 and Tox2 be the thickness of the tunnel insulating film 312 between the buffer layer 322 and the minimum nanocrystalline layer 321, an electric field of $\Delta E_2/(qTox1)$ or more must be applied to eliminate the energy barrier between the charge storage layer 330 and the buffer layer 322. An energy drop in the tunnel insulating film 312 between the buffer layer 322 and the minimum nanocrystalline layer 321 upon application of the electric field of $\Delta E_1/(qTox1)$ is $(\Delta E_1/Tox1) \times Tox2$. If the following condition:

$$\Delta E - (\Delta E_1/Tox1) \times Tox2 \geq \Delta E_1$$

is given, an energy barrier from the buffer layer to the minimum nanocrystalline layer may be formed. To the contrary, if the following condition:

$$\Delta E - (\Delta E_1/Tox1) \times Tox2 < \Delta E_1$$

is given, no energy barrier is formed. This gives the desirable condition for the desirable lower limit of $\Delta E_1$ as follows:

$$\Delta E_1 > \Delta E/(1+Tox2/Tox1)$$

The desirable upper limit of the typical particle size which is estimated from the Coulomb blockade energy is $$d_1 < (1+Tox2/Tox1)d$$

If the buffer layer is located on the upper side of the minimum nanocrystalline layer which contributes to the erase, as described above, Tox1 is the tunnel film thickness of the buffer layer on the side of the storage portion. Tox2 is the tunnel film thickness of the buffer layer on the side of the minimum nanocrystals. When the buffer layer is located on the lower side of the minimum nanocrystalline layer which contributes to the write, Tox1 is set as the tunnel film thickness of the buffer layer on the channel side and Tox2 is set as the tunnel film thickness of the buffer layer on the side of the minimum nanocrystals. If the thicknesses Tox1 and Tox2 are the typical smallest controllable high-speed write/erase film thickness, i.e., if Tox1=Tox2, then $$\Delta E_1 > \Delta E/2$$

The particle size falls within the desirable range as follows:

$$d_1 < 2d$$

If the conductive nanoparticle material is a semiconductor such as silicon nanocrystals, the energy barrier is determined from the Coulomb blockade energy and quantum confinement energy. To achieve perfect disappearance of the energy barrier generated by excessively lowering $\Delta E_1$ shown in FIG. 9(b), any energy barrier must be eliminated in the quantum confinement energy as another cause of the energy barrier in addition to the Coulomb blockade energy.

The quantum confinement energy changes in inverse proportion to the square of the particle size d and is given as $h^2/(8md^2)$ where h is the Planck constant and m is the effective mass. To also satisfy the condition $\Delta E_1 > \Delta E/(1+Tox2/Tox1)$, which makes the energy barrier generated by excessively lowering $\Delta E_1$ disappear, in the quantum confinement energy, the following condition is given:

$$d_1 < (1+Tox2/Tox1)^{1/2}d$$

This gives a more desirable upper limit of the buffer layer particle size $d_1$.

As a typical form, the smallest controllable film thickness for achieving high-speed write/erase, that is, Tox2=Tox1 falls within the following desired range:

$$d_1 < 2^{1/2}d$$

As the second typical case, the Tox2 is set thick to assure the memory retention while maintaining high-speed write/erase. A structure on the channel side strongly influences write, while a structure on the charge storage part side strongly influences erase. Tox1 is desirably thin.

On the other hand, since the memory retention is determined by the entire resistance of the tunnel films, a structure in which Tox2 is thick on the side farther from the channel or the storage part is advantageous to assure memory retention while minimizing the influence on the write/erase speed. In this case, to minimize the influence on the write/erase speed, Tox2 desirably falls within the range of 3 nm or less which allows electrons to directly pass the tunnel. Since Tox1 is considered to have a film thickness of about 1 nm which is controllable to achieve high-speed write/erase, as the second typical case, since Tox2/Tox1≤3, then the following condition is desirable:

$$d_1 < 2d$$

Assume that the buffer layer is located on the upper side of the minimum nanocrystalline layer which contributes to erase. In this case, when the charge storage part itself is made of a discrete conductor or semiconductor such as quantum dots, the information electron energy increases by $\Delta Ec$ due to the quantum effect of the charge storage part itself (FIG. 10(a)). For this reason, as the energy of the charge storage part is higher by $\Delta Ec$ in the erase mode, $\Delta E_1$ of the buffer tends to be lower in energy than $\Delta E$ of the minimum nanocrystalline layer in the absence of the energy barrier from the charge storage part to the buffer $\Delta E_1$ (FIG. 10(b)). This indicates that the erase rate is not sufficient. When the buffer layer is located on the upper side of the minimum nanocrystalline layer, the charge storage part desirably covers the entire surface of the channel surface. It is more desirable not to discretely form the charge storage part unlike the quantum dots.

In the above discussion, the energy barriers $\Delta E$ and $\Delta E_1$ and the particle sizes d and $d_1$ have distributions due to the particle size variations when plural conductive nanoparticles are used. The conditions enough to expect the effect in the presence of a plurality of nanoparticles in the conductive nanoparticles, the average values of the barriers $\Delta E$ and $\Delta E_1$ and the particle sizes d and $d_1$ are used.

In the above discussion, the particle sizes d and $d_1$ of the conductive nanoparticles are diameters of spherical or near-spherical shapes. However, the particle shapes do not even approximate a spherical shape in practice. If the particle has a spherical shape, the self capacitance for the diameter d is given as Cself=π∈d. The Coulomb blockade energy is approximated by $$q/(2Cself)=q/(2\pi \in d)$$

If the conductive nanoparticle has an aspherical shape, the effective particle size d can be specified with respect to the self capacitance Cself determined by the shape of the conductor:

$$d=Cself/(\pi \in)$$

Fourth Embodiment

In the first to third embodiments, the nanoparticle layers are formed using Si nanocrystals generated by heating the a-Si films. Another self-alignment formation method is also available.

As in the first embodiment, the fourth embodiment of a nonvolatile semiconductor memory capable of improving memory retention while maintaining low-voltage high-speed write will be described with reference to the sectional views of FIG. 11.

First of all, as shown in FIG. 11(a), a 1-nm thick thermal oxide film (first tunnel insulating film) 411 is formed on an Si substrate 400. A 2-nm thick a-Si film 426 is deposited on the thermal oxide film 411 by the CVD apparatus. A 1-nm thick oxide film (second tunnel insulating film) 412 is formed on the a-Si film 426 by thermal oxidation. The thickness of the a-Si film 426 is 1.5 nm, and the a-Si film 426 is vertically sandwiched between the 1-nm thick oxide films 411 and 412. Si nanocrystals 427 having an average particle size of 1.5 nm are formed on the oxide film 412 by the CVD apparatus.

When the initial growth nucleus of a poly-Si film is used to form the Si nanocrystals, positional control such as a surface marking method with an AFM probe can be performed, as needed. In the future, it is possible to form the Si nanocrystals 427 by controlling the position and particle size by microlithography patterning of the poly-Si film.

As shown in FIG. 11(b), when the a-Si film 426 is oxidized, Si having a size of about 1.5 nm is left immediate below the Si nanocrystals 427. When the nanocrystals are crystallized by the heating process, Si nanocrystals having a particle size of 1.5 nm are formed. That is, a first nanoparticle layer 421 is formed as a buffer layer. By this oxidation, the upper Si nanocrystals 427 are also oxidized, but oxidation can hardly progress due to the stress when the Si nanocrystals have a very small size. The nanocrystal Si can hardly be oxidized. As a result, a second nanoparticle layer 422 made of minimum Si nanocrystals having the particle size of about 1 nm and an upper oxide film (third tunnel insulating film) 413 having a particle size of about 1 nm are formed. If necessary, the particle size of the nanoparticle layer 422 and the thickness of the oxide film 413 can be controlled by diluted hydrofluoric acid treatment and oxidation.

As shown in FIG. 11(c), a 5-nm thick charge storage layer 430 is made of a silicon nitride film by LPCVD. A 7-nm thick control oxide film 440 is formed by LPCVD. A 200-nm thick n$^+$ poly-Si film serving as a gate electrode is deposited by CVD. A gate electrode 450 is then formed by etching using a resist pattern as a mask. Subsequently, phosphorus ions are implanted in the substrate at a dose of $1\times10^{15}$ cm$^{-2}$ and an acceleration voltage of 5 keV. The resultant structure undergoes high-speed annealing for 10 sec at 1,000° C. to form n$^+$ diffusion layers 402 serving as the source/drain regions. This makes it possible to form a nonvolatile semiconductor memory capable of improving memory retention while maintaining low-voltage high-speed write/erase.

According to this embodiment, as in the first embodiment, the typical size of the lower buffer Si nanocrystals is 1.5 nm, while the typical size of the upper minimum Si nanocrystals is 1 nm. As in the first embodiment, this makes it possible to improve memory retention while maintaining low-voltage high-speed write.

In this embodiment, the arrangement capable of performing high-speed write corresponding to the first embodiment has been described above as an example of forming the stacked structure of self-aligned Si nanocrystals by oxidation using the upper Si nanocrystals as a mask. The self-alignment formation by oxidation using the upper Si nanocrystals as a mask can be applied to the second embodiment capable of performing high-speed write/erase and the third embodiment capable of performing high-speed erase.

Fifth Embodiment

In the same manner as in the third embodiment, the fifth embodiment of a nonvolatile semiconductor memory capable of improving memory retention while maintaining low-voltage high-speed erase will be described with reference to the sectional views of FIG. 12.

First of all, as shown in FIG. 12(a), a 1-nm thick thermal oxide film (first tunnel insulating film) 511 is formed on an Si substrate 500. A 1.5-nm a-Si film 526 is deposited on the thermal oxide film 511 by the CVD apparatus. A 1-nm oxide film (second tunnel insulating film) 512 is formed on the a-Si film 526 by thermal oxidation. The thickness of the a-Si film 526 is 1 nm, and the a-Si film 526 is vertically sandwiched between the 1-nm thick oxide films 511 and 512. Subsequently, Si nanocrystals 527 having an average particle size of 2.5 nm are formed on the oxide film 512 by the CVD apparatus. When the initial growth nucleus of a poly-Si film is used to form the Si nanocrystals 527, positional control such as a surface marking method with an AFM probe can be performed, as needed. In the future, it is possible to form the Si nanocrystals by controlling the position and particle size by microlithography patterning of the poly-Si film.

As shown in FIG. 12(b), the oxide film 512 and the a-Si film 526 are etched by RIE (Reactive Ion Etching) using the Si nanocrystals 527 as a mask to leave 1-nm thick Si immediately below the Si nanocrystals. This Si is crystallized by the heating process to form minimum Si nanocrystals 526'. That is, a first nanoparticle layer 521 is formed. By this RIE, the upper Si nanocrystals 527 are converted into buffer Si nanocrystals 527' having a particle size larger than the nanocrystals 526' having the thickness of about 1.5 nm. That is, a second nanoparticle layer 522 is formed.

As shown in FIG. 12(c), a gap is buried with an oxide film 506 by LPCVD using a silicon oxide film. The resultant structure undergoes a diluted hydrofluoric acid treatment to an extent that the Si nanocrystals 527' are exposed, thereby forming a 1-nm upper oxide film (third tunnel insulating film) 513. The tunnel film portion is thus finished.

The subsequent steps of forming the nonvolatile semiconductor memory capable of improving memory retention while maintaining low-voltage high-speed erase are performed as in the third embodiment by forming the charge storage layer, the control oxide film, the gate electrode, and the source/drain.

In this embodiment, as in the third embodiment, the buffer Si nanocrystals 527' having a larger particle size are present on the upper side of the lower minimum Si nanocrystals 526'. Therefore, as in the third embodiment, the memory retention can be improved while maintaining low-voltage high-speed erase.

In this embodiment, the structure capable of performing high-speed erase corresponding to the third embodiment has been described as an example of forming the stacked structure of self-aligned Si nanocrystals by RIE using the upper Si nanocrystals as a mask. The self-alignment formation by RIE using the upper Si nanocrystals as a mask can be applied to the second embodiment capable of performing high-speed write/erase or the first embodiment capable of performing high-speed write.

When self-alignment formation is used as in the fourth and fifth embodiments, a sufficient effect cannot be obtained if the surface density of the Si nanocrystalline stacked structure is low. The electrostatic blockade length in Si is about 10 nm. If the surface density on the channel surface is $2.5 \times 10^{11}$ cm$^{-2}$ or more (one or more per 20 nm$^2$), nearly the entire surface of the channel is electrostatically blockaded and receives the influence of the Si nanocrystalline multilayered structure. This makes it possible to expect the effect.

Sixth Embodiment

In the first to fifth embodiments, since the conductive nanoparticles having a larger particle size serve as a buffer, the energy barrier having a low energy level serves as a buffer in the tunneling process, thus allowing high-speed write or high-speed erase. The write/erase can be performed at a higher speed by forming a multiple structure of "conductive nanoparticle buffer layers having larger particle sizes".

FIG. 13 shows an example capable of performing write at a higher speed than that of the first embodiment by employing a multiple structure. The manufacturing method is substantially the same as that of the first embodiment except that three nanoparticle layers are used.

A first nanoparticle layer 621 is formed on a first tunnel insulating film 611 formed on a channel region 601 sandwiched between the source/drain regions 602 of an Si substrate 600. A second nanoparticle layer 622 is formed on a second tunnel insulating film 612 formed on the first nanoparticle layer 621. A third nanoparticle layer 623 is formed on a third tunnel insulating film 613 formed on the second nanoparticle layer 622. A charge storage layer 630 is formed on a fourth tunnel insulating film 614 formed on the third nanoparticle layer 623. A gate electrode 650 is formed on a block insulating film 640 formed on the charge storage layer 630.

The particle sizes of the nanoparticle layers 621, 622, and 623 are as follows. The particle size of the third nanoparticle layer 623 is 1 nm in diameter as in the nanoparticle layer 122 of the first embodiment. The particle size of the second nanoparticle layer 622 is 1.5 nm in diameter as in the nanoparticle layer 121 of the first embodiment. The particle size of the first nanoparticle layer 621 is 2 nm larger than those of the third and second nanoparticle layers 623 and 622. In the structure of this embodiment, the lowermost buffer Si nanocrystals having a larger particle size are formed on the 1-nm silicon oxide film formed on the buffer Si nanocrystals in the structure of the first embodiment.

The energy barrier ΔE in the Si nanocrystals having a smaller particle size is higher than that having a larger particle size. As shown in FIG. 14(a), the energy of ΔE$_1$ of the Si nanocrystals in the second nanoparticle layer 622 is lower than that of ΔE of the Si nanocrystals in the third nanoparticle layer 623, and the energy of ΔE$_2$ of the Si nanocrystals in the first nanoparticle layer 621 is lower than that of ΔE$_1$ of the Si nanocrystals in the second nanoparticle layer 622.

With the above arrangement, as shown in FIG. 14(a), memory retention is determined by the highest energy barrier ΔE and is improved in accordance with exp(ΔE/k$_B$T) in the same manner as in the first embodiment.

As for write, since the effective tunnel bias increases to increase the tunnel current due to the energy ΔE$_2$ lower than ΔE$_1$ of the first embodiment, as shown in FIG. 14(b), write can be performed at a higher speed. In the first embodiment, to perform high speed write in the absence of the energy barrier, the write electric field of ΔE$_1$/(qTox) or more must be applied for the tunnel oxide film thickness Tox=1 nm. However, in the example shown in FIG. 13, an equivalent high-speed write in the absence of the energy barrier can be performed at the boundary of a lower write electric field ΔE$_2$/(qTox) (<ΔE$_1$/(qTox)). The example shown in FIG. 13 is more advantageous in lower voltage and higher reliability than the first embodiment.

The example shown in FIG. 13 demonstrates a structure capable of performing write at a higher speed than that of the first embodiment as an example of the multiple structure of "conductive nanoparticle buffer layers having larger particle sizes". However, the multiple structure of the "conductive nanoparticle buffer layers having larger particle sizes" can be applied to an example in which write/erase is performed at a higher speed than that of the second embodiment or an example in which erase is performed at a higher speed than that of the third embodiment.

Several desirable conditions of the buffer layer multiple structure will be described below. (1) When the buffer layer multiple structure is located on the lower side of the minimum nanocrystalline layer which has an effect in write as shown in FIG. 13, the energy barrier ΔE$_1$ and the particle size d$_1$ of the lowermost buffer layer are described as follows. (2) When the buffer layer multiple structure is located on the upper side of the minimum nanocrystalline layer which has an effect in erase, the energy barrier ΔE$_1$ and the particle size d$_1$ of the uppermost buffer layer are described as follows. That is, in either of (1) and (2), the desirable upper limit of ΔE$_1$ and the desirable lower limit d$_1$ are described by the same expressions described above:

$$\Delta E_1 \leq \Delta E - 0.1 \text{ [eV/nm]} \times Tox$$

$$d_1 > d/[1-(0.1 \text{ [eV/nm]} \times Tox)/\{q/(2\pi \in d)\}]$$

Alternatively, $$\Delta E_1 \leq \Delta E - 0.2 \text{ [eV/nm]} \times Tox$$

$$d_1 > d/[1-(0.2 \text{ [eV/nm]} \times Tox)/\{q/(2\pi \in d)\}]$$

When the effect for erase is enabled, Tox is the thickness of the tunnel insulating film between the uppermost buffer layer and the charge storage part. When the effect for write is enabled, Tox is the thickness of the tunnel insulating film between the lowermost buffer layer and the channel, as shown in FIG. 13. When the multiple structure has an effect for erase, ΔE and d are the energy barrier and the particle size immediately below the uppermost buffer layer, that is, the energy barrier and the particle size of the second upper buffer nanoparticle layer. When the buffer layer is the multiple structure which has the effect for write, ΔE and d are the energy barrier and the particle size immediately above the lowermost buffer layer, that is, the energy barrier and the particle size of the second lower buffer nanoparticle layer.

The desirable lower limit of $\Delta E_1$ and the desirable upper limit of $d_1$ are described by the same expressions described above:

$$\Delta E_1 > \Delta E/(1+Tox2/Tox1)$$

$$d_1 < (1+Tox2/Tox1)d$$

When the multiple structure contributes to erase, Tox1 is the tunnel film thickness of the tunnel film between the uppermost buffer layer and the storage portion, and Tox2 is the tunnel film thickness of the uppermost buffer layer on the channel side. When the multiple structure contributes to write, Tox1 is the tunnel film thickness between the lowermost buffer layer and the channel, and Tox2 is the tunnel film thickness of the lowermost buffer layer on the storage portion side. When the multiple structure has an effect for erase, $\Delta E$ and d are the energy and film thickness immediate below the uppermost buffer layer, i.e., the energy and film thickness of the second upper buffer nanoparticle layer. When the buffer layer is a multiple structure which has an effect for write, $\Delta E$ and d are the energy barrier and film thickness immediately above the lowermost buffer layer, i.e., the energy and particle size of the second lower buffer nanoparticle layer.

Seventh Embodiment

The above embodiments have exemplified the trap layers such as silicon nitride films and floating gates such as n+ poly-Si as typical examples of the information charge storage parts. However, Si nanocrystals can be used as the charge storage part.

Figure 15:
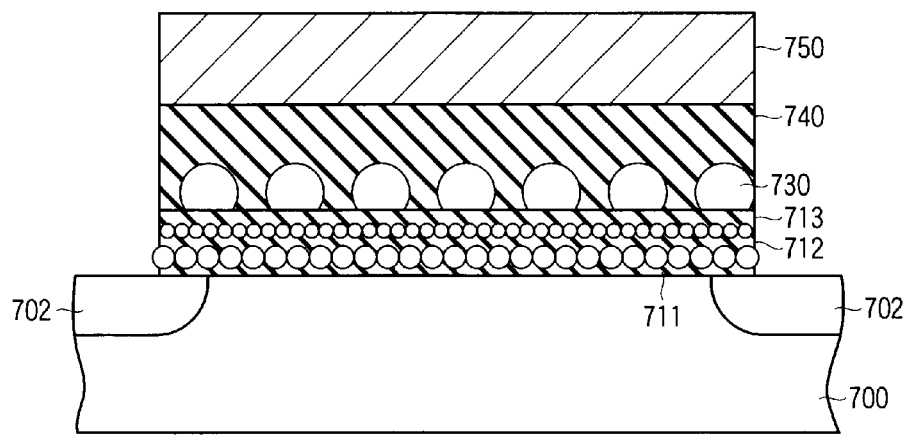
FIG. 15 is a sectional view showing the device structure of a nonvolatile semiconductor memory according to the seventh embodiment.

FIG. 15 is a sectional view showing the device structure of a nonvolatile semiconductor memory according to the seventh embodiment. Note that reference numerals 700 to 750 in FIG. 15 correspond to reference numerals 100 to 150 in FIG. 1.

The seventh embodiment is different from the first embodiment in that Si nanocrystals 730 are used in place of the silicon nitride film as the charge storage layer. The Si nanocrystals are formed to have an average particle size of, for example, 8 nm. In order to prevent memory retention from degrading due to an excessive increase in the energy of the charge storage part, the particle size of the Si nanocrystals 730 is desirably larger than that of the Si nanocrystals in the nanoparticle layers 721 and 722 in the tunnel insulating films. The layers other than the Si nanocrystals 730 are the same as in the first embodiment.

Even with the above structure, the same effect as in the first embodiment can be obtained, as a matter of course.

Eighth Embodiment

Figure 16:
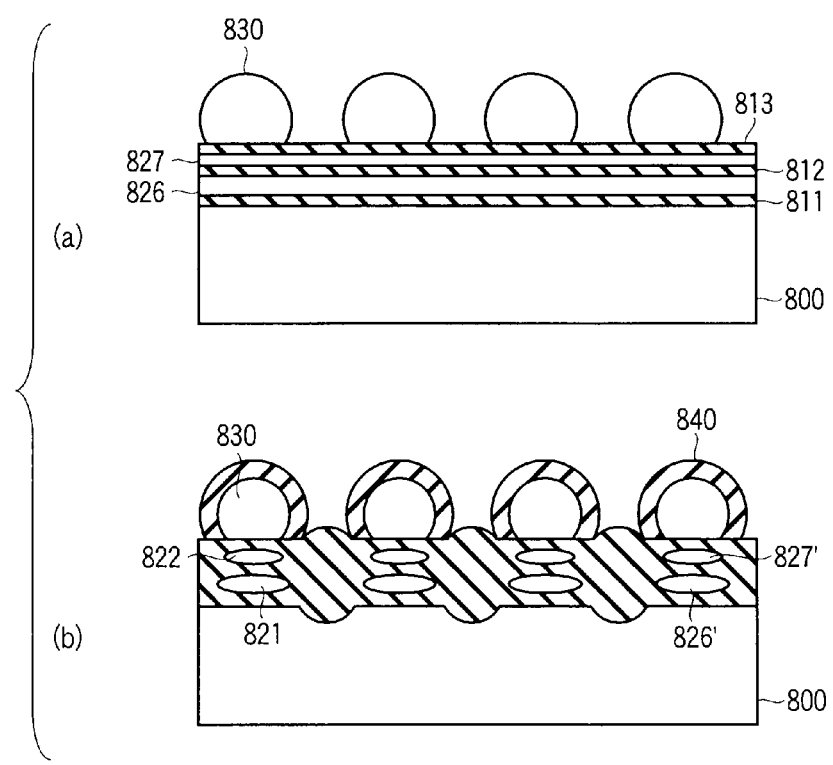
FIG. 16 shows the sectional views of the device structure of a nonvolatile semiconductor memory and steps in manufacturing the memory according to the eighth embodiment.

FIG. 16 shows sectional views of the device structure of a nonvolatile semiconductor memory and steps in manufacturing the memory according to the eighth embodiment.

As in the seventh embodiment, when the Si nanocrystals are used to form the charge storage part, the self-alignment method using the charge storage part as a mask is available. This is the same technique using the upper Si nanocrystals as a mask, as described with reference to the fourth and fifth embodiments.

As shown in FIG. 16(a), a 1-nm thick thermal oxide film (first tunnel insulating film) 811 is formed on an Si substrate 800. A 2-nm thick a-Si film 826 is deposited on the thermal oxide film 811 by the CVD apparatus. A 1-nm thick oxide film (second tunnel insulating film) 812 is formed on the a-Si film 826 by thermal oxidation. A 1.5-nm thick a-Si film 827 is deposited on the oxide film 812 by the CVD apparatus. A 1-nm thick oxide film (third tunnel insulating film) 813 is formed on the a-Si film 827 by thermal oxidation. Si nanocrystalline layer 830 having an average particle size of 8 nm and serving as the charge storage part is formed on the oxide film 813.

As shown in FIG. 16(b), the a-Si films 826 and 827 are oxidized using the Si nanocrystals 830 as a mask to form Si nanocrystals 826' and 827' right under the Si nanocrystals 830. The particle size of the Si nanocrystals 826' is 1.5 nm, and the particle size of the Si nanocrystals 827' is 1 nm. That is, a first nanoparticle layer 821 made of the Si nanocrystals having a particle size of 1.5 nm and a second nanoparticle layer 822 made of the Si nanocrystals having a particle size of 1 nm are formed.

Note that since the Si nanocrystalline layer 830 is also partially oxidized in the above oxidation process, an oxide film 840 is formed around the Si nanocrystalline layer 830. This oxide film 840 may be used as an insulating film under a gate electrode to be formed later. After an insulating film other than the oxide film 840 is formed, a gate electrode may be formed.

Even with the above structure, the same effect as in the first embodiment can be obtained, as a matter of course.

MODIFICATIONS

Note that the embodiment is not limited to the respective embodiments described above. In the each embodiment described above, Si is used as the semiconductor substrate and conductive nanoparticles. A variety of semiconductor materials other than Si can be used. Similarly, the materials of the tunnel insulating film, the block insulating film, the interlayer insulating film, and the gate electrode can be changed depending on the specifications, as needed. In each of the second and sixth embodiments, the three-layered structure has been described as the multilayered structure of the nanoparticle layer. However, four or more layers can be used as the multilayered structure. The manufacturing methods are not limited to the ones described in the respective embodiments, but can be changed as needed.

Each embodiment described above has exemplified a memory device based on an n-type MOSFET using the p-type substrate. However, the embodiment is also applicable to a memory device based on a p-type MOSFET using an n-type substrate. In this case, the tunnel resistance value of a tunnel insulating film with respect to holes and the barrier $\Delta E$ in a conductive nanoparticle layer are adjusted to have the same values as described with reference to the embodiments. Each embodiment described above uses a plurality of nanoparticles in the nanoparticle layer. However, the embodiment can be implemented using one nanoparticle.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory, comprising:
   a first tunnel insulating film on a channel region of a semiconductor portion;

a first nanoparticle layer on the first tunnel insulating film, comprising a first conductive nanoparticle satisfying a Coulomb blockade condition;
a second tunnel insulating film on the first nanoparticle layer;
a second nanoparticle layer on the second tunnel insulating film, comprising a second conductive nanoparticle satisfying the Coulomb blockade condition;
a third tunnel insulating film on the second nanoparticle layer;
a charge storage layer on the third tunnel insulating film;
an insulating film on the charge storage layer; and
a gate electrode on the insulating film,
wherein the charge storage layer has an energy level of electron which is lower than an energy level of electron of the first and second nanoparticle layers when no voltage is applied between the gate electrode and the channel region,
an average particle size (d) of a plurality of the second conductive nanoparticle is smaller than an average particle size ($d_1$) of a plurality of the first conductive nanoparticle,
an average energy value $\Delta E_1$ required for charging one electron in the first conductive nanoparticle is smaller than an average energy value $\Delta E$ required for charging one electron in the second conductive nanoparticle, and is higher than an energy level of the channel region when no voltage is applied between the gate electrode and the channel region, and
a difference between $\Delta E_1$ and $\Delta E$ is larger than a heat fluctuation energy ($k_BT$).

2. The memory of claim 1, further comprising:
a third nanoparticle layer comprising a third conductive nanoparticle satisfying the Coulomb blockade condition on the third tunnel insulating film, and
a fourth tunnel insulating film on the third nanoparticle layer,
wherein the charge storage layer is also on the fourth tunnel insulating film.

3. The memory of claim 1,
wherein letting kg be the Boltzmann constant, T be an absolute temperature, $\in$ be a dielectric constant of each tunnel insulating film, and q be the elementary electric charge, the memory satisfies a relation $$d_1 > d/[1 - k_BT/\{q/(2\pi\in d)\}]$$

wherein d and $d_1$ are in nm.

4. The memory of claim 1, wherein
letting Tox be a thickness of the first tunnel insulating film in nm, average energy values $\Delta E_1$ and $\Delta E$ satisfy a relation $$\Delta E_1 \leq \Delta E - 0.1 \times Tox \text{ [eV]}.$$

5. The memory of claim 1, wherein
letting $\in$ be a dielectric constant of each tunnel insulating film, q be the elementary electric charge, and Tox be a thickness of the first tunnel insulating film in nm, the memory satisfies a relation $$d_1 > d/[1 - (0.1 \times Tox \text{ [eV]})/\{q/(2\pi\in d)\}]$$

wherein d and $d_1$ are in nm.

6. The memory of claim 1, wherein
letting Tox [nm] be a thickness of the first tunnel insulating film, average energy values $\Delta E_1$ and $\Delta E$ satisfy a relation $$\Delta E_1 \leq \Delta E - 0.2 \times Tox \text{ [eV]}.$$

7. The memory of claim 1, wherein
letting $\in$ be a dielectric constant of each tunnel insulating film, q be the elementary electric charge, and Tox be a thickness of the first tunnel insulating film in nm, the memory satisfies a relation $$d_1 > d/[1 - (0.2 \times Tox \text{ [eV]})/\{q/(2\pi\in d)\}]$$

wherein d and $d_1$ are in nm.

8. The memory of claim 1, wherein
average energy values $\Delta E_1$ and $\Delta E$ satisfy a relation $$\Delta E_1 > \Delta E/2.$$

9. The memory of claim 1, satisfying a relation $$d_1 < 2d.$$

10. A nonvolatile semiconductor memory, comprising:
a first tunnel insulating film on a channel region of a semiconductor portion;
a first nanoparticle layer on the first tunnel insulating film, comprising a first conductive nanoparticle satisfying a Coulomb blockade condition;
a second tunnel insulating film on the first nanoparticle layer;
a second nanoparticle layer on the second tunnel insulating film, comprising a second conductive nanoparticle and satisfying the Coulomb blockade condition;
a third tunnel insulating film on the second nanoparticle layer;
a charge storage layer on the third tunnel insulating film;
an insulating film on the charge storage layer; and
a gate electrode on the insulating film,
wherein the charge storage layer has an energy level of electron which is lower than an energy level of electron of the first and second nanoparticle layers when no voltage is applied between the gate electrode and the channel region,
an average particle size ($d_1$) of a plurality of the second conductive nanoparticle is larger than an average particle size (d) of a plurality of the first conductive nanoparticle,
the memory satisfies $d_1 < 2d$,
an average energy value $\Delta E_1$ required for charging one electron in the second conductive nanoparticle is smaller than an average energy value $\Delta E$ required for charging one electron in the first conductive nanoparticle, and is higher than an energy level of the channel region when no voltage is applied between the gate electrode and the channel region, and
a difference between $\Delta E_1$ and $\Delta E$ is larger than a heat fluctuation energy ($k_BT$).

11. The memory of claim 1, wherein
the first conductive nanoparticle and the second conductive nanoparticle each independently comprise a Si nanocrystal.

12. The memory of claim 1, wherein
the first tunnel insulating film, the second tunnel insulating film, and the third tunnel insulating film each independently comprise a silicon oxide film.

13. The memory of claim 1, wherein
the charge storage layer comprises a conductor or a dielectric which traps a carrier.

14. The memory of claim 1, wherein
a surface density of the first conductive nanoparticle and a surface density of the second conductive nanoparticle are each independently not less than $2.5 \times 10^{11}$ cm$^{-2}$.

15. A nonvolatile semiconductor memory, comprising:
a first tunnel insulating film on a channel region of a semiconductor portion;

a first nanoparticle layer on the first tunnel insulating film, comprising a first conductive nanoparticle satisfying a Coulomb blockade condition;

a second tunnel insulating film on the first nanoparticle layer;

a second nanoparticle layer on the second tunnel insulating film, comprising a second conductive nanoparticle satisfying the Coulomb blockade condition;

a third tunnel insulating film on the second nanoparticle layer;

a third nanoparticle layer comprising a third conductive nanoparticle satisfying the Coulomb blockade condition on the third tunnel insulating film;

a fourth tunnel insulating film on the third nanoparticle layer;

a charge storage layer on the fourth tunnel insulating film an insulating film on the charge storage layer; and a gate electrode on the insulating film, wherein the charge storage layer has an energy level of electron which is lower than an energy level of electron of the first, second and third nanoparticle layers when no voltage is applied between the gate electrode and the channel region, an average particle size (d) of a plurality of the second conductive nanoparticle is smaller than an average particle size ($d_1$) of a plurality of the first conductive nanoparticle, an average energy value $\Delta E_1$ required for charging one electron in the first conductive nanoparticle is smaller than an average energy value $\Delta E$ required for charging one electron in the second conductive nanoparticle, and is higher than an energy level of the channel region when no voltage is applied between the gate electrode and the channel region, and a difference between $\Delta E_1$ and $\Delta E$ is larger than a heat fluctuation energy ($k_B T$).

* * * * *